US012782985B2

(12) United States Patent
Santana

(10) Patent No.: US 12,782,985 B2
(45) Date of Patent: Nov. 3, 2026

(54) METHODS FOR POWER LEVEL TRANSITIONING IN APPLIANCES

(71) Applicant: Haier US Appliance Solutions, Inc., Wilmington, DE (US)

(72) Inventor: Omar Santana, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 977 days.

(21) Appl. No.: 17/829,418

(22) Filed: Jun. 1, 2022

(65) Prior Publication Data

US 2023/0393596 A1 Dec. 7, 2023

(51) Int. Cl.

| | |
|---|---|
| ***G05D 23/19*** | (2006.01) |
| ***A23L 5/10*** | (2016.01) |
| ***F24C 3/12*** | (2006.01) |
| ***F24C 7/08*** | (2006.01) |
| ***H03K 7/08*** | (2006.01) |

(52) U.S. Cl.

CPC ............ *G05D 23/1951* (2013.01); *A23L 5/15* (2016.08); *F24C 3/12* (2013.01); *F24C 7/08* (2013.01); *H03K 7/08* (2013.01)

(58) Field of Classification Search

CPC . C12N 15/111; C12N 15/113; C12N 15/8218; C12N 15/8245; C12N 15/8246; C12N 15/8247; C12N 15/8251; C12N 15/8261; C12N 15/8271; C12N 15/8274; C12N 15/8279; C12N 15/8281; C12N 15/8283; C12N 15/8285; C12N 2310/14; C12N 2320/11; C12N 15/82; C12N 15/63; C12N 15/11; C12N 15/09; C12N 5/04; C12N 5/10; A23L 5/15; A23L 5/10; F24C 3/12; F24C 7/08; F24C 7/087; G05D 23/1951; G05D 23/19; H03K 7/08; A01H 1/00; A01H 5/00; C07H 21/02

See application file for complete search history.

(56) References Cited

U.S. PATENT DOCUMENTS 8,274,020 B2 * 9/2012 Donarski ............. F24C 15/106 219/486
10,641,497 B2 * 5/2020 Park ........................ F24C 7/087

FOREIGN PATENT DOCUMENTS

| | | |
|---|---|---|
| CN | 109602289 A | 4/2019 |
| CN | 109938616 A | 6/2019 |
| CN | 111246611 A | 6/2020 |

* cited by examiner

*Primary Examiner* — Woody A Lee, Jr.
*Assistant Examiner* — Adam M Eckardt
(74) *Attorney, Agent, or Firm* — Dority & Manning, P.A.

(57) ABSTRACT

A method of operating a cooking appliance includes initiating, at a controller, a cooking operation at a first duty cycle. Determining, by the controller, a power level change. Comparing, at the controller, the first duty cycle to a second duty cycle of the power level change. Determining, by the controller, a state of the first duty cycle that comprises one of an on semi-cycle and an off semi-cycle, a passed time of the first duty cycle, and a new time of the second duty cycle. Calculating, by the controller, an additional time of the first duty cycle by subtracting the passed time of the first duty cycle from the new time of the second duty cycle. Then adjusting, at the controller, the power level change and the state of the second duty cycle in response to the additional time passing.

13 Claims, 7 Drawing Sheets

METHODS FOR POWER LEVEL TRANSITIONING IN APPLIANCES

FIELD OF THE INVENTION

The present subject matter relates generally to methods for transitioning between power levels in appliances, particularly cooking appliances.

BACKGROUND OF THE INVENTION

Cooking appliances frequently include heating elements that can be cycled on and off, such as electrical heating elements and gas burners. Such heating elements can be cycled on or off during operation depending on the amount of heating power needed by the cooking cycle. Typically, the power is controlled with a predefined frequency or period. During the cycle period, the ratio of the time the heating element is on versus the total time can be changed to produce different power levels. This ratio of time on to total time is commonly referred to as the duty cycle.

Whenever the user or the cooking algorithm operating the cooking appliance calls for a change in power level, the duty cycle of the heating element can be changed. In an open-loop cooking (OLC) scenario, the user could manually change the power level as desired during the cooking cycle. Similarly, during cooking in a closed-loop cooking (CLC) scenario, the power level change can occur at any time during the power cycle, during either the on or off portions of the duty cycle. This can cause back-to-back on or off portions of the duty cycle, extending the amount of time the heating element remains in that state.

BRIEF DESCRIPTION OF THE INVENTION

Aspects and advantages of the invention will be set forth in part in the following description, or may be apparent from the description, or may be learned through practice of the invention.

In one example embodiment, a method of operating a cooking appliance includes initiating, at a controller, a cooking operation at a first duty cycle. Determining, by the controller, a power level change. Comparing, at the controller, the first duty cycle to a second duty cycle of the power level change. Determining, by the controller, a state of the first duty cycle that comprises one of an on semi-cycle and an off semi-cycle, a passed time of the first duty cycle, and a new time of the second duty cycle. Calculating, by the controller, an additional time of the first duty cycle by subtracting the passed time of the first duty cycle from the new time of the second duty cycle. Then adjusting, at the controller, the power level change and the state of the second duty cycle in response to the additional time passing.

In another example embodiment, a method of operating an appliance includes, initiating, at a controller, an operation at a first duty cycle. Determining, by the controller, a power level change. Comparing, at the controller, the first duty cycle to a second duty cycle of the power level change. Determining, by the controller, a state of the first duty cycle that comprises of an on semi-cycle and an off semi-cycle. Then adjusting, at the controller, the power level change and the state of the second duty cycle in response to the completion of the state of the first duty cycle.

In another example embodiment, a method of operating an appliance during a duty cycle includes initiating, at a controller, a first duty cycle. Determining, by the controller, a power level change. Comparing, at the controller, the first duty cycle to a second duty cycle of the power level change. Determining, by the controller, a state of the first duty cycle that comprises one of an on semi-cycle and an off semi-cycle, a passed time of the first duty cycle, and a new time of the second duty cycle. Calculating, by the controller, an additional time of the first duty cycle by subtracting the passed time of the first duty cycle from the new time of the second duty cycle. Then adjusting, at the controller, the power level change and the state of the second duty cycle in response to the additional time passing.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

Figure 1:
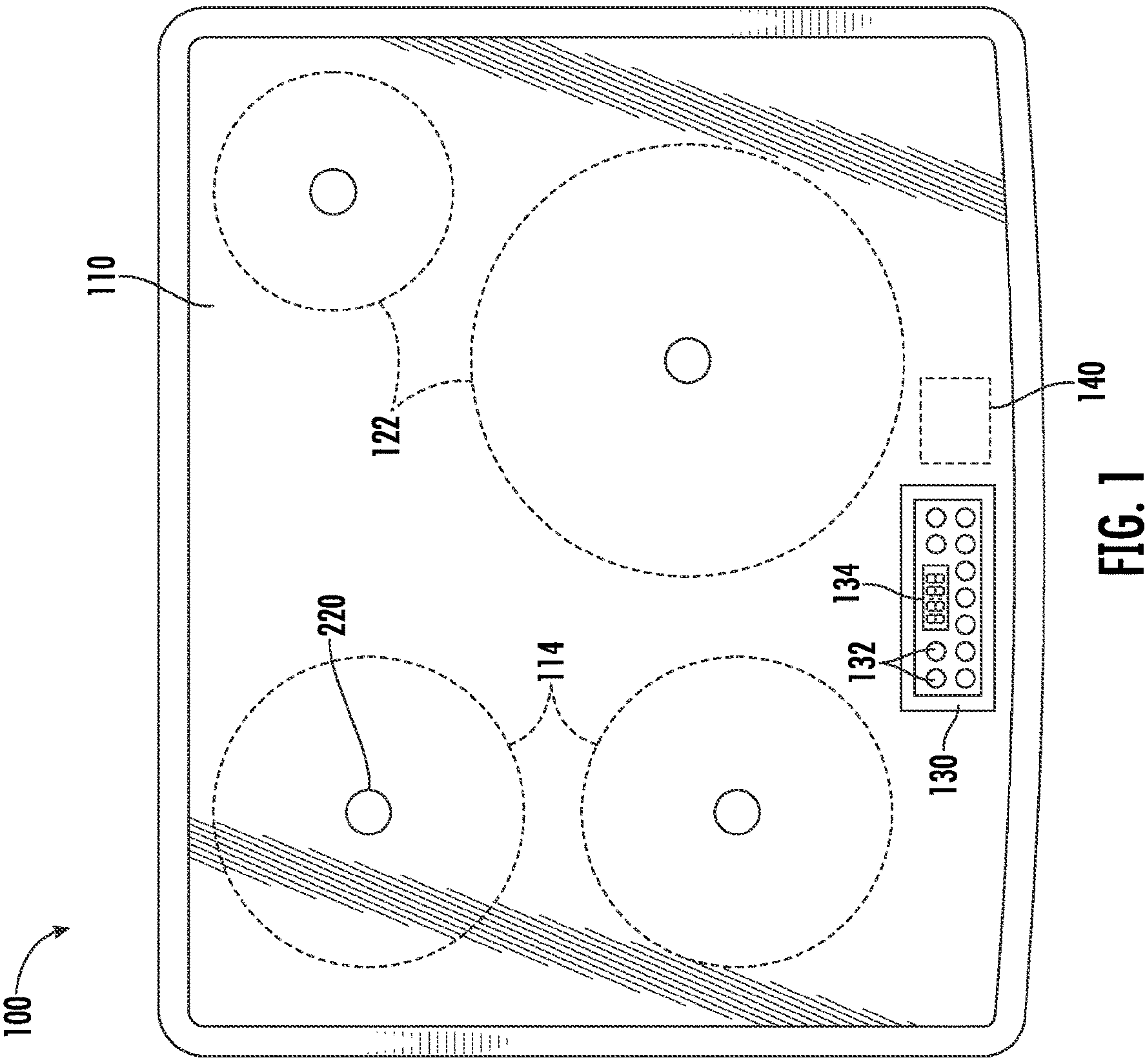
FIG. 1 provides a top, plan view of a cooktop appliance in accordance with an example embodiment of the present subject matter.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first," "second," and "third" may be used interchangeably to distinguish one component from another and are not intended to signify location or importance of the individual components. The terms "includes" and "including" are intended to be inclusive in a manner similar to the term "comprising." Similarly, the term "or" is generally intended to be inclusive (i.e., "A or B" is intended to mean "A or B or both"). Approximating language, as used herein throughout the specification and claims, is applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. For example, the approximating language may refer to being within a ten percent (10%) margin. Similarly, a state of operation modified by the term "semi-cycle" is not meant to be limited to exactly half of a cycle, as the "semi-cycle" may be more or less than half of the cycle.

Figure 2:
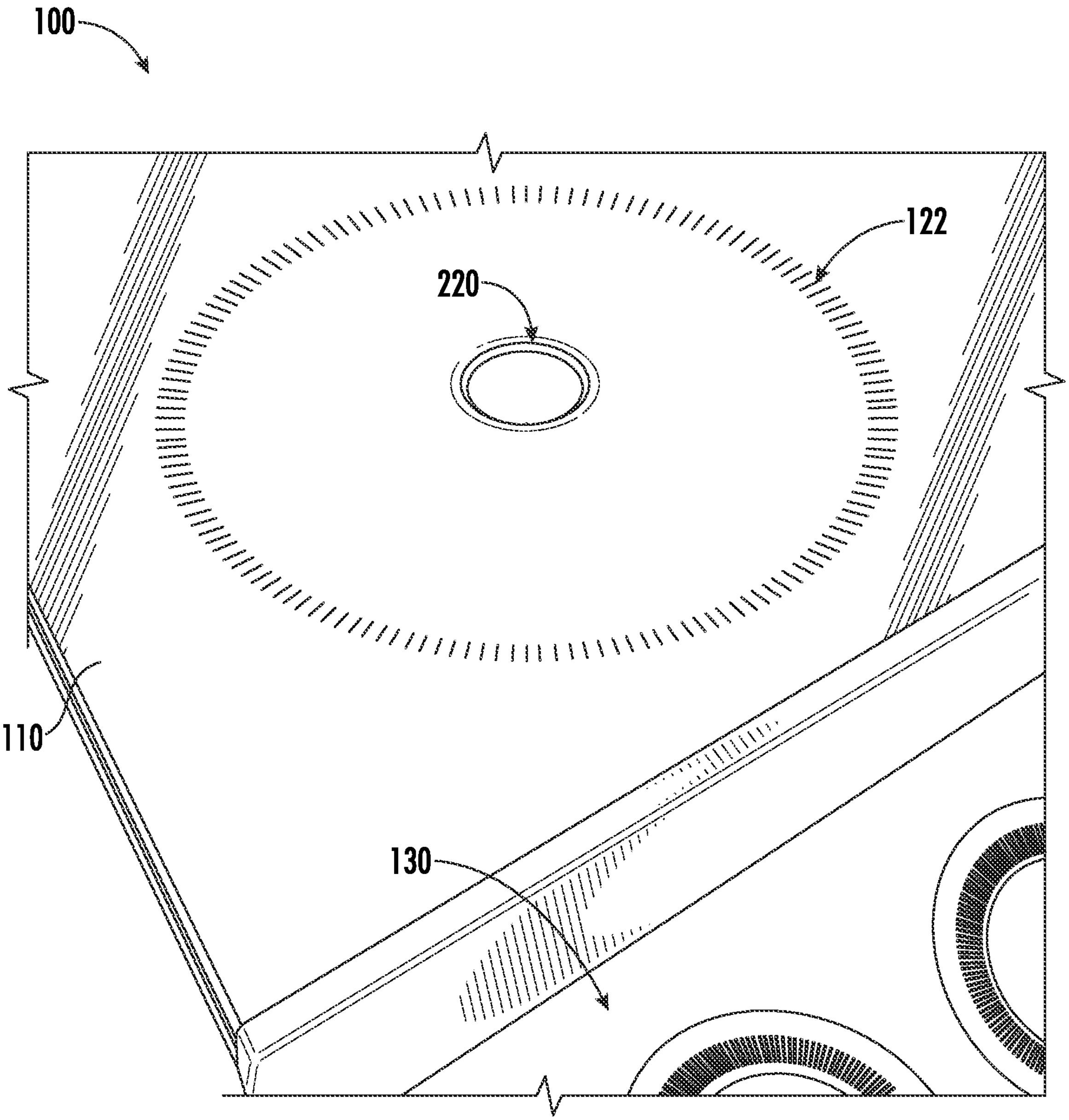
FIG. 2 provides a perspective view of a portion of a cooktop appliance in accordance with an example embodiment of the present subject matter.

Referring now to the figures, FIG. 1 provides a top, plan view of a cooktop appliance 100 according to an example embodiment of the present subject matter. FIG. 2 provides a perspective view of a portion of an example embodiment of a cooktop appliance 100. Cooktop appliance 100 can be installed in various locations such as in cabinetry in a kitchen, with one or more ovens to form a range appliance, or as a standalone appliance. Thus, as used herein, the term "cooktop appliance" includes grill appliances, stove appliances, range appliances, and other appliances that incorporate cooktops. One of skill in the art would appreciate aspects of the present disclosure may additionally be incorporated into other cooking appliances such as wall ovens or other suitable cooking appliances that may not include a cooktop, and that cooktop appliance 100 is provided by way of example only.

Cooktop appliance 100 includes a ceramic plate 110 for supporting cooking utensils, such as pots or pans, on a cooking or top surface 114 of ceramic plate 110. Ceramic plate 110 may be any suitable ceramic or glass plate. Heating assemblies 122 are mounted below ceramic plate 110 such that heating assemblies 122 are positioned below ceramic plate 110, as would be understood in the art. Ceramic plate 110 may be continuous over heating assemblies 122. FIG. 2 depicts the sensor assembly 220 in ceramic plate 110. In the current embodiment, sensor assembly 220 is positioned through a center of a heating assembly 122. However, it should be appreciated that in other embodiments, sensor assembly 220 may be offset from the center, such as positioned along a radius from the center. In other embodiments, sensor assembly 220 may also be built into the cooking utensil or may be an accessory. Sensor assembly 220 may be used to detect the temperature of the cooking utensil placed thereon.

While shown with four heating assemblies 122 in the example embodiment of FIG. 1, cooktop appliance 100 may include any number of heating assemblies 122 in alternative example embodiments. Heating assemblies 122 can also have various diameters or areas. For example, each heating assembly 122 can have a different diameter, the same diameter, or any suitable combination thereof, or other surface areas. Heating assembly 122 may particularly be configured as induction heating assemblies. However, cooktop appliance 100 is provided by way of example only and is not limited to the example embodiment shown in FIG. 1. For example, a cooktop appliance having one or more heating assemblies in combination with one or more electric radiant or resistance heating elements, including a convection heater, or one or more gas burner heating elements, may be provided. In addition, various combinations of number of heating assemblies, position of heating assemblies and/or size of heating assemblies can be provided. It will also be understood that the present subject matter is suitable for use with other electric heating elements, such as induction heating elements.

Cooktop appliance 100 may be controlled by a control board or controller 140. Controller 140 may be in communication (via for example a suitable wired or wireless connection) to components of cooktop appliance 100, such as heating assembly 122. By way of example, controller 140 may include a memory and one or more processing devices such as microprocessors, CPUs or the like, such as general or special purpose microprocessors operable to execute programming instructions or micro-control code associated with operation of cooktop appliance 100. The memory may be a separate component from the processor or may be included onboard within the processor. The memory may represent random access memory such as DRAM, or read only memory such as ROM or FLASH.

A user interface 130 provides visual information to a user and allows a user to select various options for the operation of cooktop appliance 100. For example, displayed options can include a desired heating assembly 122, a desired cooking temperature, and/or other options. User interface 130 can be any type of input device and can have any configuration. In FIG. 1, user interface 130 is located within a portion of ceramic plate 110. Alternatively, user interface 130 can be positioned on a vertical surface near a front side of cooktop appliance 100 or anywhere convenient for a user to access during operation of cooktop appliance 100.

In the example embodiment shown in FIG. 1, user interface 130 includes a capacitive touch screen input device component 132. Capacitive touch screen input device component 132 may permit a user to selectively activate, adjust, or control any or all heating assemblies 122 as well as any timer features or other user adjustable inputs. Thus, the user inputs may be in communication with controller 140. A user of cooktop appliance 100 may interact with the user inputs to operate the cooktop appliance 100, and user commands may be transmitted between the user inputs and controller 140 to facilitate operation of the cooktop appliance 100 based on such user commands. One or more of a variety of electrical, mechanical or electro-mechanical input devices including rotary dials, push buttons, toggle/rocker switches, and/or touch pads can also be used singularly or in combination with capacitive touch screen input device component 132. User interface 130 also includes a display component 134, such as a digital or analog display device designed to provide operational feedback to a user.

Heating assembly 122 of cooktop appliance 100 may be cycled between an on semi-cycle and an off semi-cycle. The power to heating assembly 122 may be cycled during a cooking operation depending on the amount of heating power, otherwise known as the power level, that is needed by the cooking operation. Generally, the power may be controlled with a predefined frequency/period. During this cycle period, the ratio of the on semi-cycle time versus the total period time may be changed to produce different power levels, and the ratio may be called a duty cycle. Whenever a user or a cooking algorithm calls for a power level change, the duty cycle of heating assembly 122 may be changed. The duty cycle may start with the on semi-cycle. Generally, cooking appliances, such as cooktop appliance 100, have a predefined duty cycle period, i.e., in the present example embodiment the duty cycle is twenty seconds (20 s) during normal open-loop control (OLC) with no temperature feedback. The user may manually change the level as desired during the cooking operation, and thus, the power level change can occur at any time during the duty cycle period.

During closed-loop control (CLC), a user may set a desired cooking temperature, and an appliance algorithm adjusts the power level during the cooking operation based upon sensor feedback. In CLC, like in OLC, the cooking algorithm can change the power level at any time during the duty cycle period. Since the change to a new power level in both OLC and CLC is not always synchronous with the duty cycle, known appliances restart the duty cycle immediately when the change in power level is requested, i.e., the current duty cycle may be cut short in either the on semi-cycle or the off semi-cycle. This immediate response may cause back-to-back on or off semi-cycles, extending the amount of time in either the on semi-cycle or the off semi-cycle. This results in power and temperature deviations from expected values.

Figure 5:
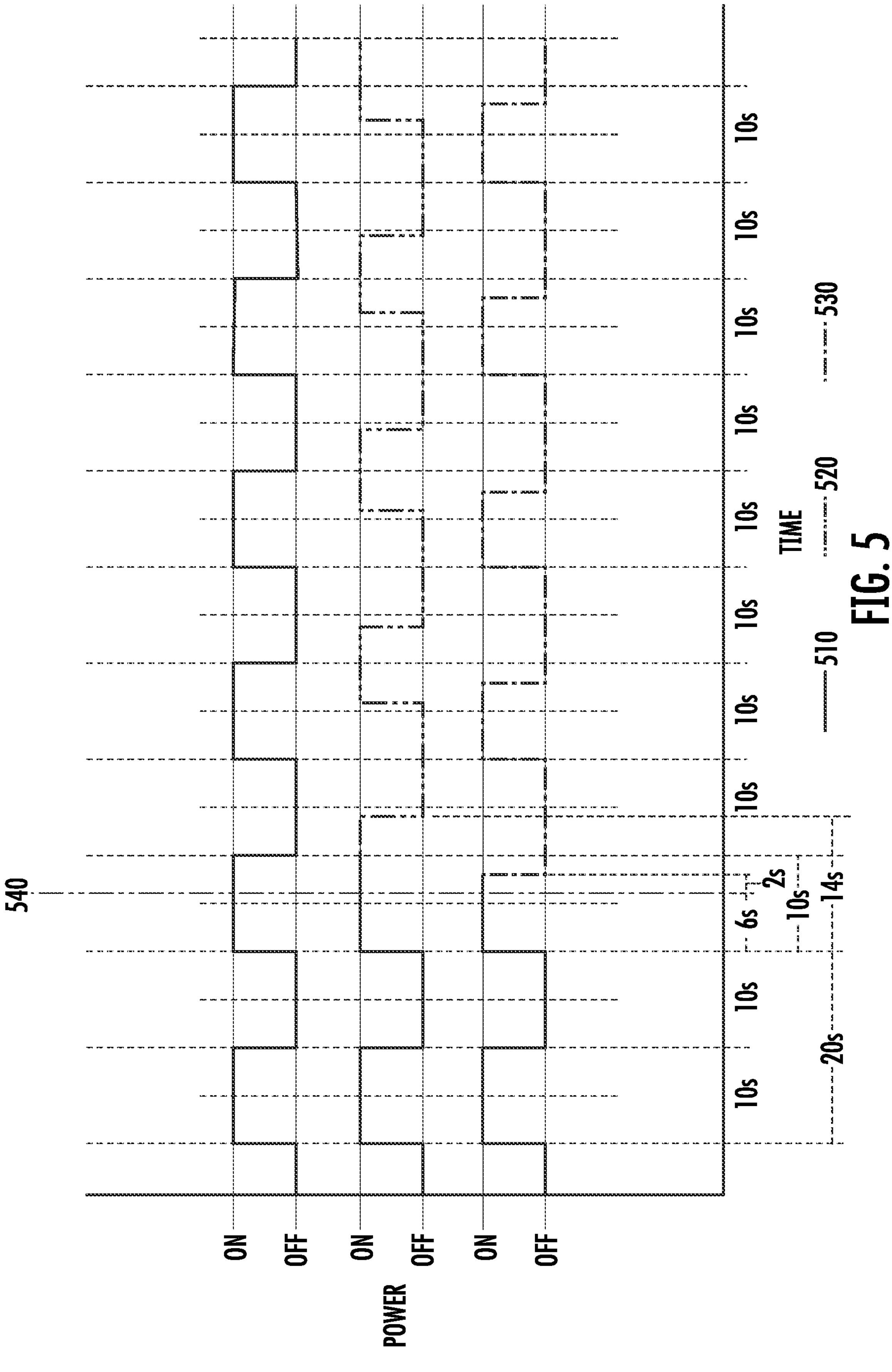
FIG. 5 is a plot of heating element activation state versus time during the example method of FIG. 3 on a cooktop appliance in accordance with an example embodiment of the present subject matter.

FIG. 5 illustrates a plot detailing the duty cycle and transitioning from a first duty cycle to a second duty cycle. Specifically, FIG. 5 provides an example of a back-to-back on semi-cycle after the conventional method of operation changes the power level, and the effect of a method 300 on the transition between the duty cycles. Method 300 will be described in further detail herein. In this example, the power cycle is started in the on semi-cycle. The solid line 510 shows a typical power cycle at a fifty percent (50%) duty cycle, i.e., the first duty cycle is ten seconds (10 s) in the on semi-cycle followed by ten seconds (10 s) in the off semi-cycle. The dash-dot-dot line 540 shows a power level change to a forty percent (40%) duty cycle occurring six seconds (6 s) into the ten second (10 s) on semi-cycle time of the first duty cycle. With the second duty cycle being forty percent (40%), the new time, specifically the new on-time, of the second duty cycle is eight seconds (8 s). In conventional methods of operation, the new power level may be applied immediately and may start in the on semi-cycle. Therefore, eight seconds (8 s) is added to the active, on semi-cycle for a total of fourteen seconds (14 s), which is longer than the on semi-cycle is expected to last, as shown by the dash-dot-dot line 520.

Figure 3:
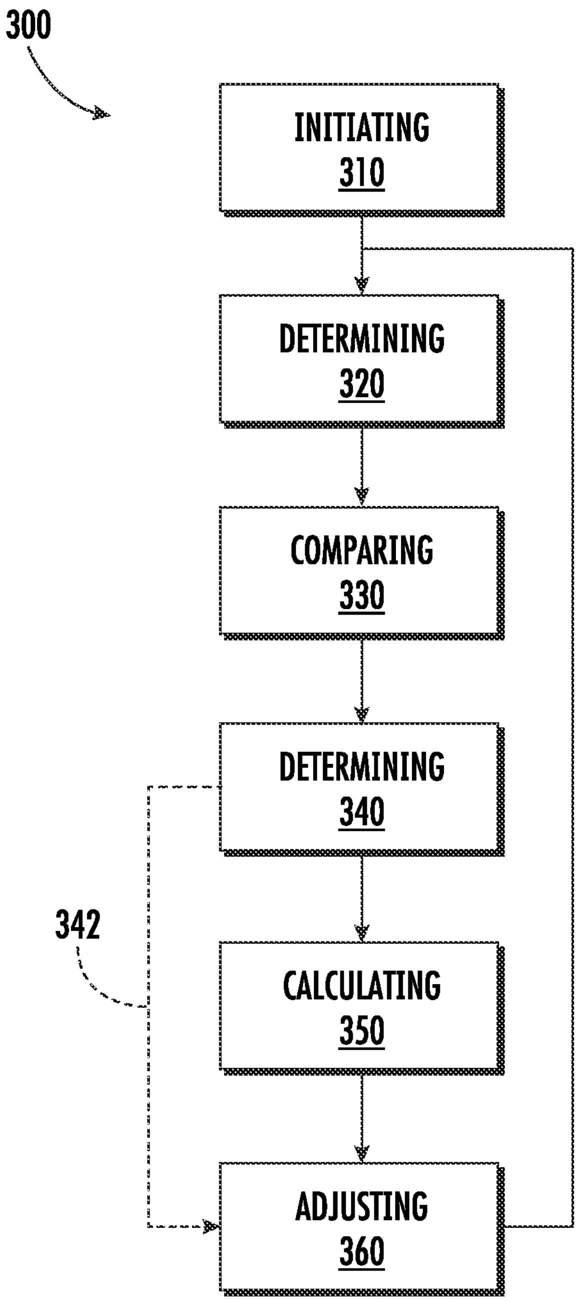
FIG. 3 illustrates a method of operating a cooktop appliance in accordance with an example embodiment of the present subject matter

Referring now to FIG. 3, illustrated is method 300 of operating a cooking appliance. At 310, a user may start, or initiate at the controller, the cooking operation and the initial power level may be set either by the user or the appliance algorithm, depending on the type of cooking operation (OLC or CLC). During OLC, the user may manually set the desired power level at any time. During CLC, the appliance algorithm will set and change power levels as needed, depending on the current measured temperature. At 320, controller 140 may determine a power level change while the cooking operation is active. If there is no power level change, the algorithm may remain at 320 until the power level changes, or the cooking operation is ended. At the end of the cooking operation, the power level may be changed to zero percent (0%). One of skill in the art would understand however that the power level may be set to 0% at the end of the cooking operation, because the cooking element is completely turned off. A power level change to zero percent (0%) during operation may not be an indication of the cooking operation ending. In CLC, the power level of zero percent (0%) is a valid power value. For example, the algorithm may adjust the power level to zero percent (0%) to quickly reduce the temperature to a lower setpoint, or to maintain the temperature at a low value.

If a power level change is determined, at 330, controller 140 may compare the first duty cycle of the current power level, to a second duty cycle of the power level change. In response to the second duty cycle, at 340, controller 140 may determine the state of the current power cycle, i.e., whether the first duty cycle is in one of the on or off semi-cycle. In addition to the state of the current power cycle, at 340, controller 140 may also determine a passed time of the first duty cycle, i.e., how much time has occurred while in the current state, and a new time of the second duty cycle, i.e., how much time the second duty cycle spends in the current state. At 350, controller 140 may calculate an additional time of the first duty cycle by subtracting the passed time of the first duty cycle from the new time of the second duty cycle. This is best shown in FIG. 5 as further described herein.

At 360, controller 140 may adjust the power level change and the state of the second duty cycle in response to the additional time passing. The change of the state of the second duty cycle may be opposite to the state of the first duty cycle (on to off, or off to on). At 342, the dashed line indicates a scenario where the passed time of the first duty cycle may be greater than or equal to the new time of the second duty cycle, thus calculating additional time at 350 may not be necessary and method 300 may go directly from 340 to 360. Method 300 may be repeated for any further power level changes.

For example, in a scenario where in an on semi-cycle and the passed time of the first duty cycle is greater than or equal to the new on time of the second duty cycle, controller 140 may adjust the power level change and start the second duty cycle in the off semi-cycle. In another scenario where in the on semi-cycle and the passed time of the first duty cycle is less than the new on time of the second duty cycle, controller 140 may calculate and extend the time of the on semi-cycle until the time of the on semi-cycle matches the new on time of the second duty cycle. Then, controller 140 may adjust the power level change, starting in the off semi-cycle.

Method 300 may also apply in scenarios where the first duty cycle is in the off semi-cycle. In a scenario where the first duty cycle is in the off semi-cycle and the passed time is greater than or equal to the new off time, controller 140 may adjust the power level change and start the second duty cycle in the on semi-cycle. In another scenario where in the off semi-cycle and the passed time of the first duty cycle is less than the new off time of the second duty cycle, controller 140 may calculate and extend the time of the off semi-cycle until time of the off semi-cycle matches the new off time of the second duty cycle. Then, controller 140 may adjust the power level change, starting in the on semi-cycle.

Referring again to FIG. 5, the dash-dot line 530 may illustrate the effect of method 300 compared to the conventional method of operation, i.e., the dash-dot-dot line 520. In the scenario of FIG. 5, the cooking operation is in the on semi-cycle when the power level change occurs. The passed time, six seconds (6 s) of the first duty cycle is less than the new time, eight seconds (8 s) of the second duty cycle, thus controller 140 calculates and extends the time of the on semi-cycle an additional two seconds (2 s), i.e., by subtracting the passed time of the first duty cycle from the new time of the second duty cycle. Then, controller 140 may start the second duty cycle in the off semi-cycle.

Figure 4:
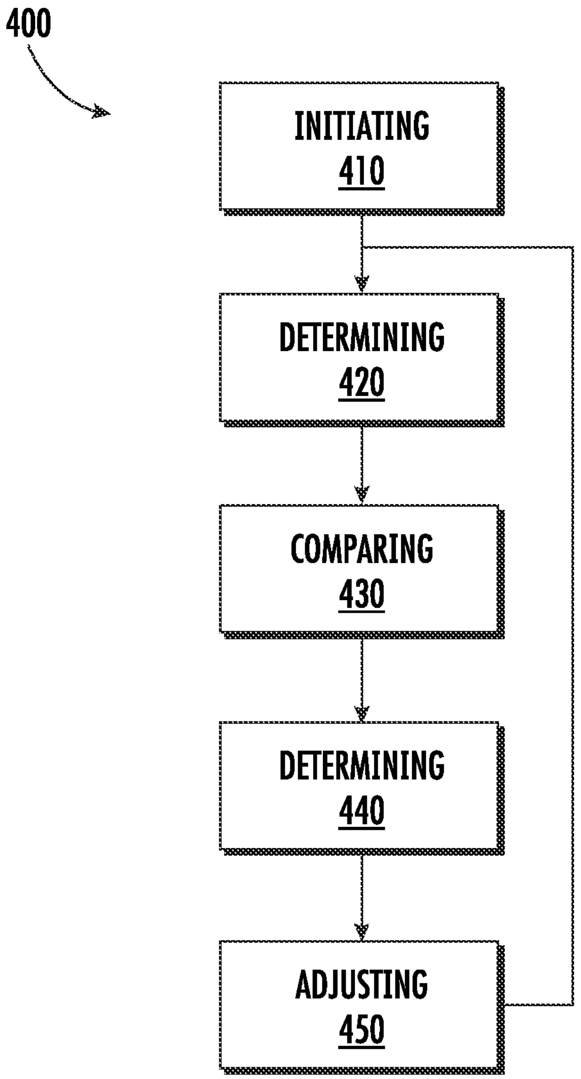
FIG. 4 illustrates a method of operating a cooktop appliance in accordance with an example embodiment of the present subject matter.

Shown in FIG. 4, a method 400 demonstrates another example embodiment of the present disclosure. Method 400 begins at 410 where a user may start, or initiate at the controller, the cooking operation and the initial power level may be set either by the user or the appliance algorithm, depending on the type of cooking operation (OLC or CLC). During OLC, the user may manually set the desired power level at any time. During CLC, the appliance algorithm will set and change power levels as needed, depending on the current measured temperature. At 420, controller 140 may determine a power level change while the cooking operation is active. If there is no power level change, the algorithm may remain at 420 until the power level changes, or the cooking operation is ended.

If a power level change is determined, at 430, controller 140 may compare the first duty cycle of the current power level, to a second duty cycle of the power level change. In response to the second duty cycle, at 440, controller 140 may determine the state of the current power cycle, i.e., the first duty cycle is in one of the on or off semi-cycle. Controller 140 may then wait until the end of the current on or off semi-cycle before at 450 adjusting to the second duty cycle, starting in the opposite semi-cycle of the current on or off semi-cycle.

Figure 6:
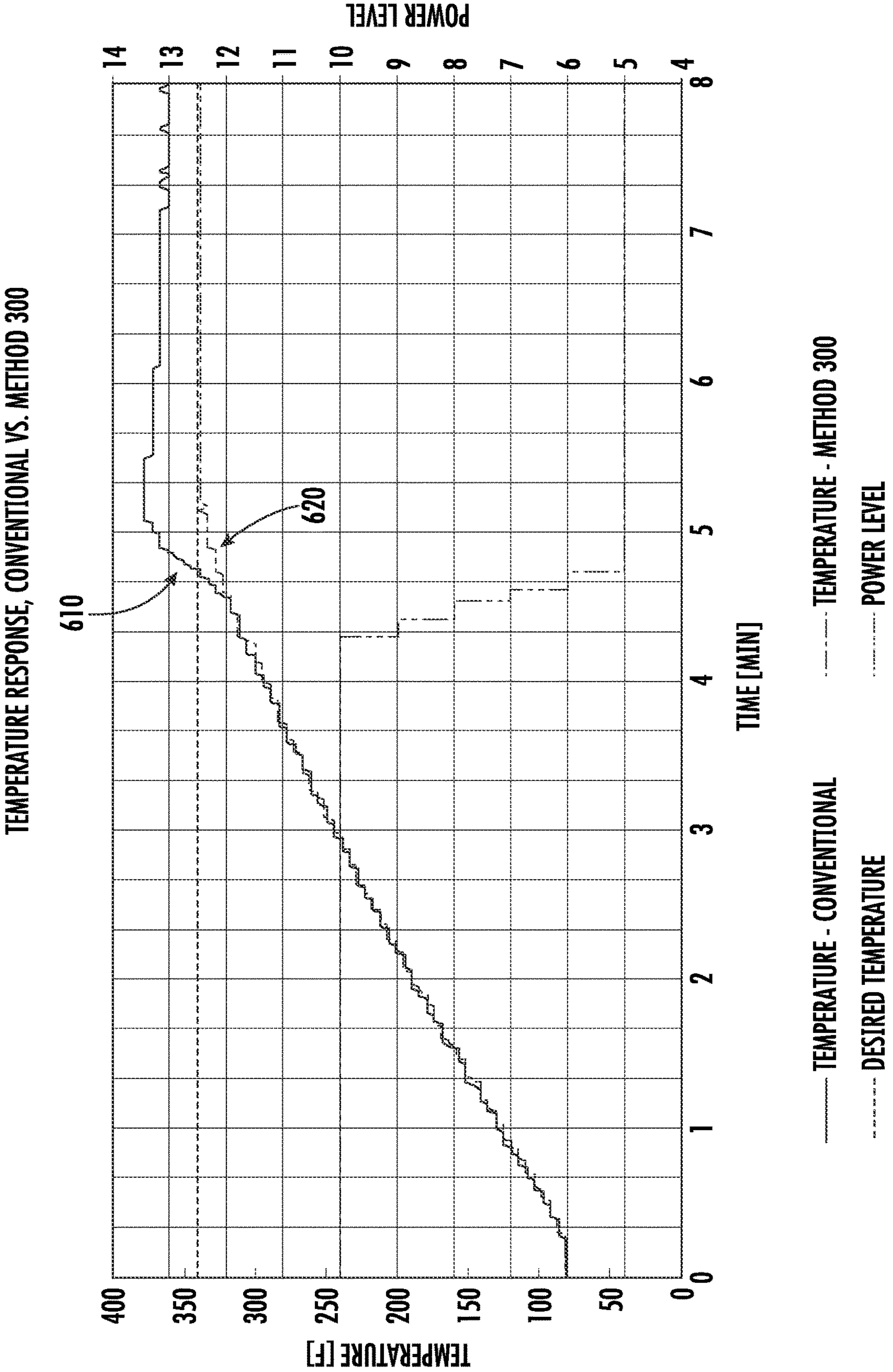
FIG. 6 is a plot of temperature versus time during the example method of FIG. 3 in accordance with an example embodiment of the present subject matter.

To better illustrate the benefits of method 300, FIG. 6 provides an example plot of the temperature response of the conventional solution to the temperature response of method 300, for the same sequence of power level changes. The example test was performed on a nineteen hundred (1900) Watts radiant cooktop element with power cycle period of twenty (20) seconds. The power level was manually changed based on visual temperature feedback, in order to achieve a desired temperature. The initial power level was set to ten (10), then reduced to power level five (5), one (1) level at a time, every six to eight seconds (6 s to 8 s). As may be seen in FIG. 6 the conventional method of operation overshoots the desired temperature, while method 300 reaches and maintains the desired temperature. The conventional method of operation exhibits a rate of change increase 610 in temperature when the power level changes occur, whereas method 300 exhibits a rate of change decrease 620, which is less than the rate 610.

Figure 7:
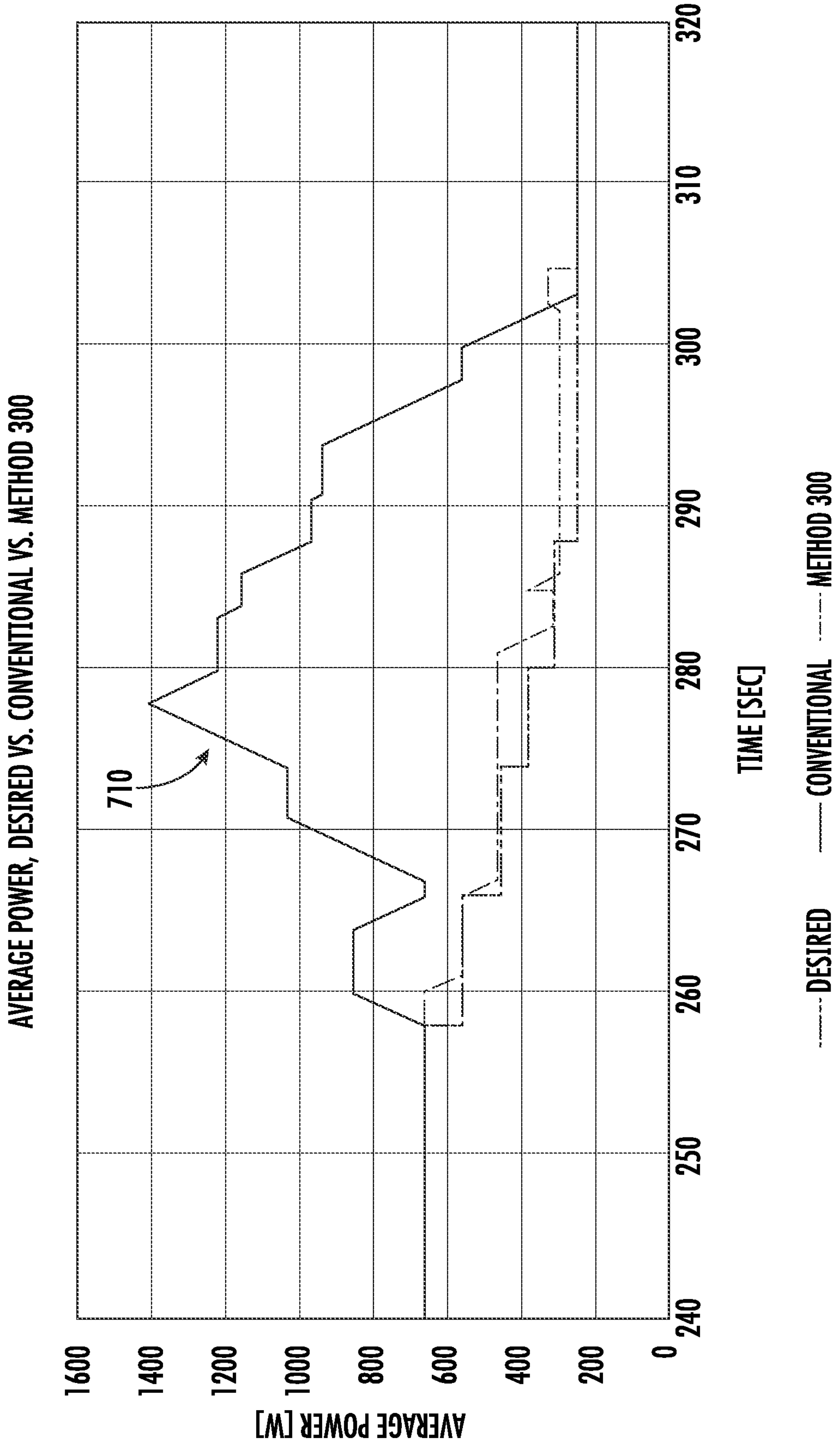
FIG. 7 is a plot of average power versus time during the example method of FIG. 3 in accordance with an example embodiment of the present subject matter.

Supplemental to the example plot provided in FIG. 6, FIG. 7 plots the calculated twenty second (20 s) average power for the conventional method of operation and method 300. The conventional method of operation produces an increased period of average power 710 when the power level changes occur. This relates to the rate of change increase 610 in temperature. The increased average power 710 may occur because of the extended on semi-cycle, i.e., multiple back-to-back on semi-cycles of the duty cycle. This may be caused by multiple power changes occurring within a short period of time, which may then extend the amount of time the heating element remains in the on state. Method 300, on the other hand, exhibits average power similar to the desired average power. Thus, the rate of change decrease 620 in temperature. FIGS. 6 and 7 are provided by way of example only and are meant to be non-limiting to the present disclosure.

Other example embodiments may exist wherein the algorithm may wait until the end of the current power cycle (e.g., twenty (20) seconds) before adjusting to the new power level with the second duty cycle. This example embodiment may be less ideal than method 300. For instance, the power level change may not take effect as quickly and could cause a delayed response in situations that could be as long as the power cycle period, i.e., twenty seconds (20 s). Another example embodiment may exist wherein a CLC system may have a sampling time equal to the power cycle period. The sampling time in CLC is a length of time between temperature readings and power level changes. In this example embodiment, a new power level would be requested exactly at the start of a new power cycle, thus preventing back-to-back on or off semi-cycles. However, this example embodiment may reduce the accuracy of the CLC cooking algorithm.

Each embodiment of the present disclosure may be used in cooking appliances during power level changes and duty cycling, or in any appliance, with any parameter where the duty cycle is changed at any time during operation. FIGS. 3 and 4 depict steps performed in a particular order for purposes of illustration and discussion. Those of ordinary skill in the art, using the disclosures provided herein, will understand that the steps of any of the methods discussed herein may be adapted, rearranged, expanded, omitted, or modified in various ways without deviating from the scope of the present disclosure. Moreover, although aspects of methods 300, 400 are explained using cooktop appliance 100 as an example, it should be appreciated that these methods may be applied to the operation of any suitable appliance.

As may be seen from the above, the present disclosure may provide a method or methods of operating an appliance in order to avoid back-to-back on or off semi-cycles, i.e., prolonged time in the on or off semi-cycles resulting in temperatures and power levels different than desired. Thus, overall, the disclosed methods may result in better power and temperature control, reduced power and temperature errors, and better cooking performance than conventional methods of operation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of operating a cooking appliance, the cooking appliance comprising a heating element and a controller in operative communication with the heating element, the method comprising:

initiating, by the controller of the cooking appliance, a cooking operation, the cooking operation comprising operating the heating element for a plurality of duty cycles, wherein each duty cycle of the plurality of duty cycles comprises an on semi-cycle duration and an off semi-cycle duration, wherein each duty cycle of the plurality of duty cycles comprises activating the heating element for the on semi-cycle duration of the respective duty cycle followed by deactivating the heating element for the off semi-cycle duration of the respective duty cycle;

receiving, by the controller, a power level setting change of the heating element during a first on semi-cycle duration of a first duty cycle of the plurality of duty cycle, the power level setting change of the heating element corresponding to a second duty cycle ratio of the heating element;

comparing, by the controller, the first duty cycle to the second duty cycle ratio in response to the power level setting change;

determining, with the controller, a passed time of the first on semi-cycle of the first duty cycle, and a new time of the second duty cycle ratio;

calculating, by the controller, an additional on semi-cycle duration of the first on semi-cycle duration of the first duty cycle based at least in part on the passed time of the first on semi-cycle duration of the first duty cycle and the new time of the second duty cycle ratio; and operating, by the controller, the heating element at the second duty cycle ratio in response to the additional time passing.

2. The method of claim 1, wherein the cooking appliance is one of an oven, a range, and a cooktop.

3. The method of claim 1, wherein the heating element is one of an electrical calrod, a coil, a convection heater, and a gas burner.

4. The method of claim 1, wherein an initial power level is set when initiating the cooking operation.

5. The method of claim 1, further comprising determining an end of the cooking operation in response to one of a user input and expiration of a timer.

6. The method of claim 5, further comprising, after adjusting the power level setting change and the state of the second duty cycle, determining another power level setting change.

7. The method of claim 1, further comprising adjusting, with the controller, the power level setting change and the state of the second duty cycle in response to the passed time of the first duty cycle being greater than or equal to the new time of the second duty cycle.

8. A method of operating an appliance, the appliance comprising a heating element and a controller in operative communication with the heating element, the method comprising:

initiating, by the controller of the appliance, an operation, the operation comprising operating the heating element for a plurality of duty cycles, wherein each duty cycle of the plurality of duty cycles comprises an on semi-cycle duration and an off semi-cycle duration, wherein each duty cycle of the plurality of duty cycles comprises activating the heating element for the on semi-cycle duration of the respective duty cycle followed by deactivating the heating element for the off semi-cycle duration of the respective duty cycle;

receiving, by the controller, a power level setting change of the heating element during a first off semi-cycle duration of a first duty cycle of the plurality of duty cycle, the power level setting change of the heating element corresponding to a second duty cycle ratio of the heating element;

comparing, by the controller, the first duty cycle to the second duty cycle ratio in response to the power level setting change;

determining, with the controller, a passed time of the first off semi-cycle of the first duty cycle, and a new time of the second duty cycle ratio;

calculating, by the controller, an additional off semi-cycle duration of the first off semi-cycle duration of the first duty cycle based at least in part on the passed time of the first off semi-cycle duration of the first duty cycle and the new time of the second duty cycle ratio; and operating, by the controller, the heating element at the second duty cycle ratio in response to the additional time passing.

9. The method of claim 8, wherein the cooking appliance is one of an oven, a range, and a cooktop.

10. The method of claim 8, wherein the heating element is one of an electrical calrod, a coil, a convection heater, and a gas burner.

11. The method of claim 8, wherein an initial power level is set when initiating the cooking operation.

12. The method of claim 8, further comprising determining an end of the cooking operation in response to one of a user input and expiration of a timer.

13. The method of claim 12, further comprising, after adjusting the power level setting change and the state of the second duty cycle, determining another power level setting change.

* * * * *